United States Patent
Endou

[11] Patent Number: 5,929,488
[45] Date of Patent: *Jul. 27, 1999

[54] METAL-OXIDE SEMICONDUCTOR DEVICE

[75] Inventor: Kazuo Endou, Yokohama, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/764,274

[22] Filed: Dec. 12, 1996

Related U.S. Application Data

[63] Continuation of application No. 08/416,203, Apr. 4, 1995, abandoned.

[30] Foreign Application Priority Data

Apr. 5, 1994 [JP] Japan .................................. 6-066832

[51] Int. Cl.⁶ ................................................ H01L 27/01
[52] U.S. Cl. .................................... 257/347; 257/508
[58] Field of Search ................................ 257/347, 348, 257/349, 350, 351, 352, 353, 354, 501, 506, 507, 508, 520, 409

[56] References Cited

U.S. PATENT DOCUMENTS

| | | | |
|---|---|---|---|
| 4,875,086 | 10/1989 | Malhi et al. | 257/506 |
| 5,241,211 | 8/1993 | Tashiro | 257/347 |
| 5,283,461 | 2/1994 | Beason | 257/508 |
| 5,355,022 | 10/1994 | Sugahara et al. | 257/506 |
| 5,391,911 | 2/1995 | Beyer et al. | 257/347 |
| 5,612,552 | 3/1997 | Owens | 257/347 |
| 5,623,166 | 4/1997 | Olowolafe et al. | 257/915 |
| 5,659,190 | 8/1997 | Litwin | 257/273 |
| 5,793,107 | 8/1998 | Nowak | 257/717 |

FOREIGN PATENT DOCUMENTS

| | | |
|---|---|---|
| 60-143 656 | 7/1985 | Japan . |
| 1-154 567 | 6/1989 | Japan . |
| 3-95937 | 4/1991 | Japan ................................ 257/347 |
| 3-214773 | 9/1991 | Japan ................................ 257/347 |
| 4-003455 | 1/1992 | Japan ................................ 257/347 |
| 4-003456 | 1/1992 | Japan ................................ 257/347 |
| 4-063469 | 2/1992 | Japan ................................ 257/347 |
| 4-150 070 | 5/1992 | Japan . |
| 4-179271 | 6/1992 | Japan ................................ 257/350 |
| 4-226082 | 8/1992 | Japan ................................ 257/349 |
| 5-235 014 | 9/1993 | Japan . |

OTHER PUBLICATIONS

Wolf et al, Silicon Processing for the VlSI Era, vol. 1, pp. 372, 399, 1986.

Electro/86 and Mini/Micro Northeast Conference Record, vol. 11, pp. 13/4 1–8, 1986, K. Owyang, et al., "New High Voltage I.C. Technology for Power Control and Conditioning".

Primary Examiner—David B. Hardy
Assistant Examiner—Huy Bui
Attorney, Agent, or Firm—Oblon, Spivak, McClelland, Maier & Neustadt, P.C.

[57] ABSTRACT

Formed on a grounded semiconductor substrate, via an insulation layer, is a semiconductor layer of the same conductive type as that of the substrate. Formed on the semiconductor layer are source and drain regions of the different conductive type from that of the substrate. The drain region is formed so that its portion reaches the insulation layer. A gate insulation film is formed on the semiconductor layer and a gate electrode is formed on the gate insulation film and between the source and drain regions. A conductive member is embedded in a through hole formed from a portion of the semiconductor layer to the semiconductor substrate via the insulation layer. A source electrode is formed so that the conductive member in the through hole and the source region are connected to each other by means of the source electrode. A drain electrode is connected to the drain region. A common source MOS device is thus formed without a wiring to ground the source by means of the conductive member embedded in the through hole that connects the source electrode to the grounded semiconductor substrate.

13 Claims, 4 Drawing Sheets

METAL-OXIDE SEMICONDUCTOR DEVICE

This application is a Continuation of application Ser. No. 08/416,203, filed on Apr. 4, 1995, now abandoned.

BACKGROUND OF THE INVENTION

The present invention relates to a MOS (Metal-Oxide Semiconductor) device. Particularly, this invention relates to a common source MOS device for high frequencies.

High power gains have recently been required for common source MOS devices for high frequencies. This requirement is satisfied by providing such MOS devices with configuration of thin film SOI (Silicon On Insulator) with a semiconductor layer (an active region) of some 10 nm. These SOI-type MOS devices have a completely depleted active region (a layer over an insulation layer in SOI configuration) under a channel region to reduce depletion layer capacity and junction capacity and also output capacity that is one of parameters to decide power gain.

FIG. 1 shows a conventional SOI-type MOS device for high frequencies. In FIG. 1, the MOS device has the SOI configuration with a p-type semiconductor substrate 101, an insulation layer 102 and a p-type semiconductor layer 103.

Formed on the SOI configuration are a n-type source and drain regions 104 and 105. A gate electrode 107 is formed above the semiconductor layer 103 via a gate oxide film 106 and between the source and drain regions 104 and 105. The drain region 105 is formed so that its portion reaches the insulation layer 102.

The surface of the semiconductor layer 103 except covered with the gate oxide film 106 is covered with a silicon oxide film 112. The gate electrode 107 is covered with a protective film 113 made of BPSG (Boron Phosho Silicate Glass).

Source and drain electrodes 110 and 111 are respectively formed on openings made in portions of the silicon oxide film 112 and the protective film 113 on the surface under which the semiconductor layer 103 and the source region 104 are next to each other and on the surface of the drain region 105.

The semiconductor layer 103 is avoided to be in floating-state by a connection between a portion of the surface of the source region 104 and that of the semiconductor layer 103 by means of the source electrode 110. A source-wiring 115 made of a fine wire is provided for grounding the source electrode 110.

As described above, the conventional SOI-type MOS device is provided insulation between the semiconductor substrate 101 and the semiconductor layer 103 by means of the insulation layer 102. This insulation requires that the semiconductor substrate 101 and the source electrode 110 be separately grounded for this type of MOS device to be applied to a common source MOS-FET (Field-Effect Transistor). The source electrode 110 is thus connected (grounded) to the semiconductor substrate 101 via the wiring 115. This causes a problem in that the inductance of the wiring 115 becomes equal to the ground inductance and hence reduces power gains for high frequencies.

SUMMARY OF THE INVENTION

The present invention provides a MOS device with low ground inductance and output capacity and preferable power gains for high frequencies.

The semiconductor device according to the present invention includes: a semiconductor substrate of a specific conductive type; an insulation layer; and a semiconductor layer of the conductive type stacked on the semiconductor substrate via the insulation layer. The semiconductor layer and the semiconductor substrate are connected to each other by means of a conductive member of the conductive type embedded in a through hole formed from a portion of the semiconductor layer to the semiconductor substrate via the insulation layer.

The semiconductor device according to the present invention is a MOS (metal-Oxide Semiconductor) device including: a grounded semiconductor substrate of a first conductive type; an insulation layer formed on the semiconductor substrate; a semiconductor layer of the first conductive type formed on the insulation layer; a source region of a second conductive type formed on the semiconductor layer; a drain region of the second conductive type formed on the semiconductor layer, a portion of the drain region reaching the insulation layer; a gate insulation layer formed on the semiconductor layer and between the source and drain regions; a gate electrode formed on the insulation layer and between the source and drain regions; a conductive member of the first conductive type embedded in a through hole formed from a portion of the semiconductor layer to the semiconductor substrate via the insulation layer; a source electrode for connecting the conductive member to the source region; and a drain electrode connected to the drain region. The source electrode is connected to the grounded semiconductor substrate by means of the conductive member embedded in the through hole.

The MOS device may have another conductive member formed between an inner wall of the through hole and the conductive member embedded therein. The other conductive member is made of a different material from a material of the embedded conductive member.

In the MOS device, the through hole may be formed so that the conductive member embedded therein surrounds portions of the source and drain regions.

In the MOS device, the through hole may be formed so that the conductive member embedded therein surrounds the source and drain regions.

In the MOS device, the insulation layer may be a thermal oxide film or an ion implantation layer.

In the MOS device, the conductive member is of 4 $\mu$m×100 $\mu$m in cross section and 10 $\mu$m in depth in the through hole.

In the MOS device, the conductive member is of 100 $\mu\Omega$·cm or less in resistivity.

In the MOS device, the embedded conductive member and the other conductive member are of 100 $\mu\Omega$·cm or less in combined resistivity.

In the MOS device, the conductive member is made of aluminium, aluminium silicide, tungsten silicide, molybdenum silicide, titanium silicide or impurity-doped polysilicon of $10^{19}$ cm$^{-3}$ or more.

In the MOS device, the other conductive member is made of impurity-doped polycrystal silicon or metal silicide.

DETAILED DESCRIPTION OF THE PREFERRED EMBODIMENTS

Figure 1:
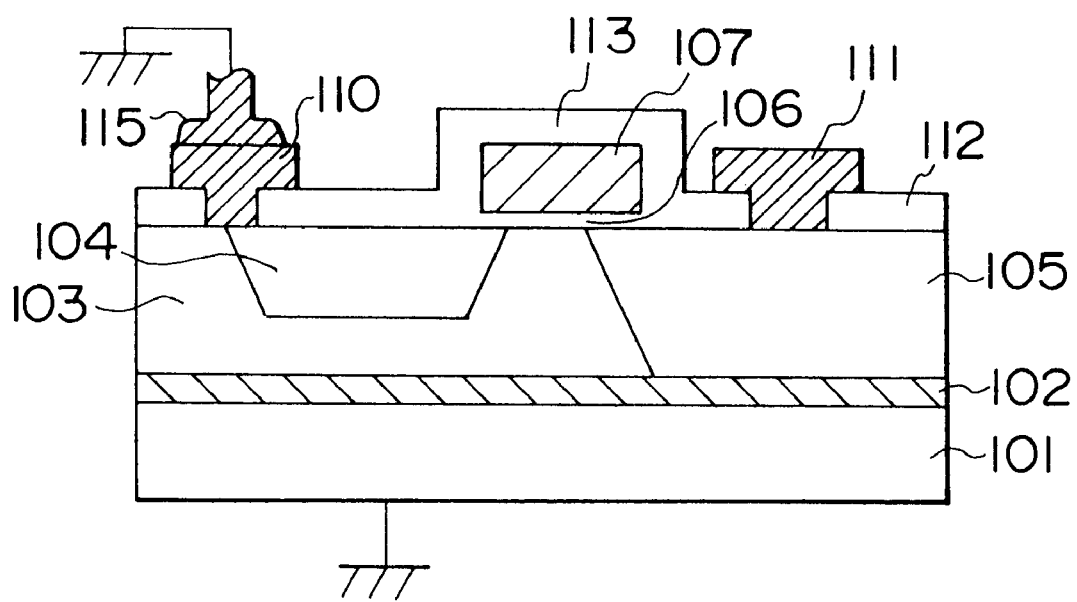
FIG. 1 is a sectional view of a conventional MOS device.
Figure 2A:
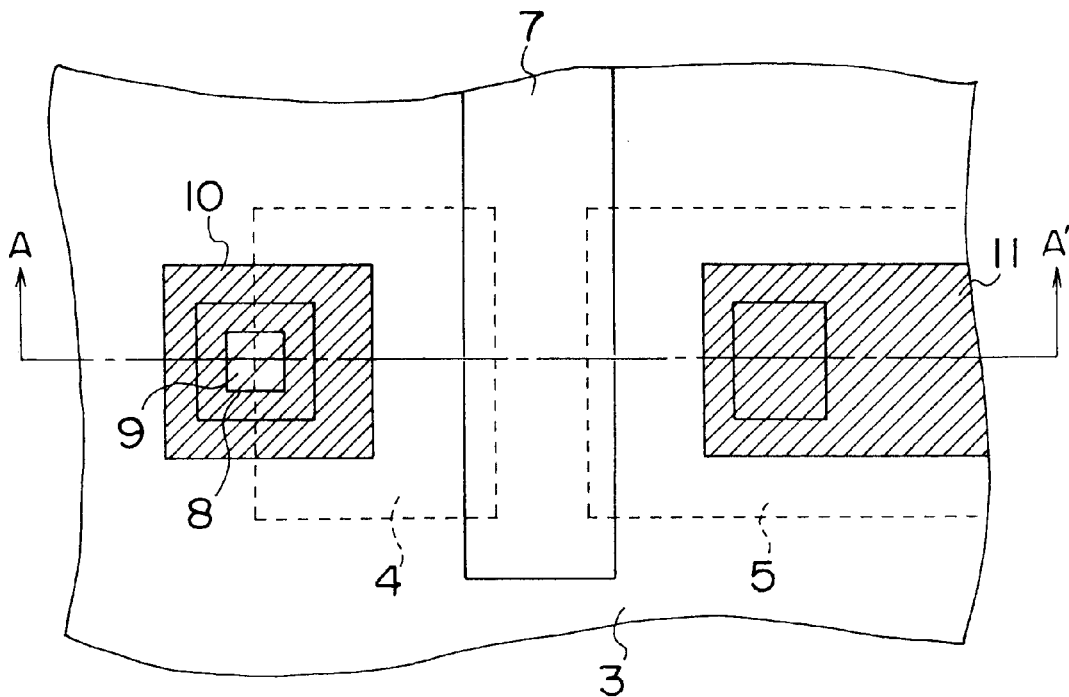
FIGS. 2A and 2B are top and sectional views, respectively, of the first preferred embodiment of the MOS device according to the present invention.
Figure 2B:
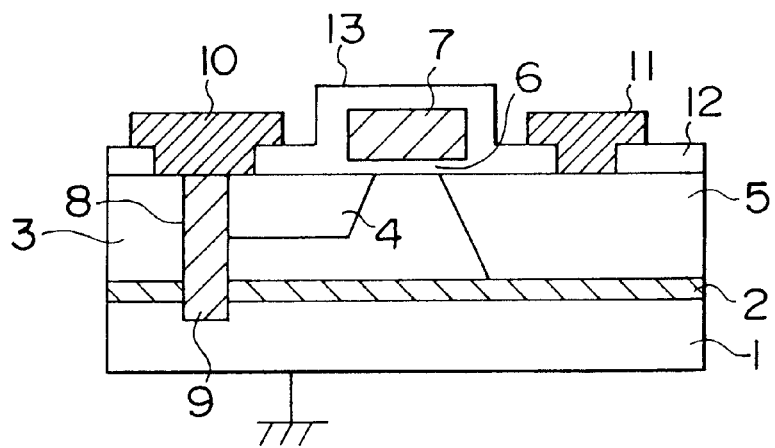

Described with reference to FIGS. 2A and 2B is the first preferred embodiment of the MOS device according to the present invention.

In FIGS. 2A and 2B, formed on the surface of a grounded p-type semiconductor substrate 1 with boron (an impurity) of concentration about $4 \times 10^{19}$ cm$^{-3}$ is an insulation layer 2 made of oxide silicon with thickness less than about 1 $\mu$m by adhesion or SIMOX (Separation by Implanted Oxygen). The insulation layer 2 becomes a thermal oxide film when produced by adhesion, while an ion implantation layer by SIMOX. Formed on the insulation layer 2, by epitaxial growth, is a p-type semiconductor layer 3 with boron (an impurity) of concentration about $3 \times 10^{15}$ cm$^{-3}$. Formed on the semiconductor layer 3 are source and drain regions 4 and 5 of concentration about $9 \times 10^{19}$ cm$^{-3}$. The drain region 5 is formed to reach the insulation layer 2.

Formed on the semiconductor layer 3 and between the source and drain regions 4 and 5 via a gate oxide film 6 of 250 angstrom is a gate electrode 7 with length of about 0.4 $\mu$m and thickness of 3,000 angstrom. The gate electrode 7 is made of polysilicon, a metal of a high melting point and a metal silicide of a high melting point, etc.

A trench 8 of about 4 $\mu$m×100 $\mu$m in cross section with depth of 10 $\mu$m is formed in the semiconductor layer 3 and in the region next to the source region 4. This trench is further formed so that it penetrates through the semiconductor layer 3 and the insulation layer 2 to reach the semiconductor substrate 1. Embedded and filled in onto an opening of the trench 8 is a first conductive member 9 made of aluminum with resistivity of 100 $\mu\Omega$·cm or less. The first conductive member 9 is of 4 $\mu$m×100 $\mu$m in cross section with depth of 10 $\mu$m. Further, the first conductive member 9 may be of aluminum silicide, tungsten silicide, molybdenum silicide, titanium silicide and impurity-doped polysilicon of $10^{19}$ cm$^{-3}$ or more, etc., other than aluminum.

The trench 8 is formed as follows: after the SOI configuration of the semiconductor substrate 1, the insulation layer 2 and the semiconductor layer 3 is formed, a trench is formed that penetrates the semiconductor layer 3 and reaches the surface of the insulation layer 2 by reactive etching with an oxide film as a mask; next, the trench is extended by wet etching to penetrate the insulation layer 2 and reach the surface of the semiconductor substrate 1; again by reactive etching, the trench is further extended to penetrate an upper portion of the semiconductor substrate 1.

A source electrode 10 made of aluminum is formed so that it bridges the surfaces of the source region 4 and the first conductive member 9. It is better to provide the contact areas of source electrode 10 with the source region 4 and the first conductive member 9 as large as possible. This increases current capacity to reduce contact resistance. The source electrode 10 may be of impurity-doped polysilicon instead of aluminum.

A drain electrode 11 is formed on the exposed surface of the drain region 5. The exposed surface except the area on which the drain electrode 11 is formed is covered with a silicon oxide film 12. The gate electrode 7 is covered with a protective film 13 made of BPSG with 5,000 angstrom in thickness.

The first preferred embodiment described above has such configuration in that the first conductive member 9 is embedded in the trench 8 formed such that it penetrates the semiconductor layer 3 and the insulation layer 2 and reaches the grounded semiconductor substrate 1 and the first conductive member 9 is connected to the source region 4 via the source electrode 10 without a long wiring. This configuration reduces the inductance from the source region 4 to the ground due to the inductance parasitic on the wiring (the first conductive member 9) to ⅕ or less of such inductance of the conventional semiconductor device and hence prevents power gains from being reduced.

The first preferred embodiment provides the source region 4 and the trench 8 touching each other as shown in FIGS. 2A and 2B. However, the source region 4 and the first conductive member 9 may be electrically connected to each other without the touch of the source region 4 and the trench 8 each other. FIG. 2B shows the rectangular trench 8, however, this may be of trapezoid in which the opening area of the trench is larger than its bottom area.

Figure 3:
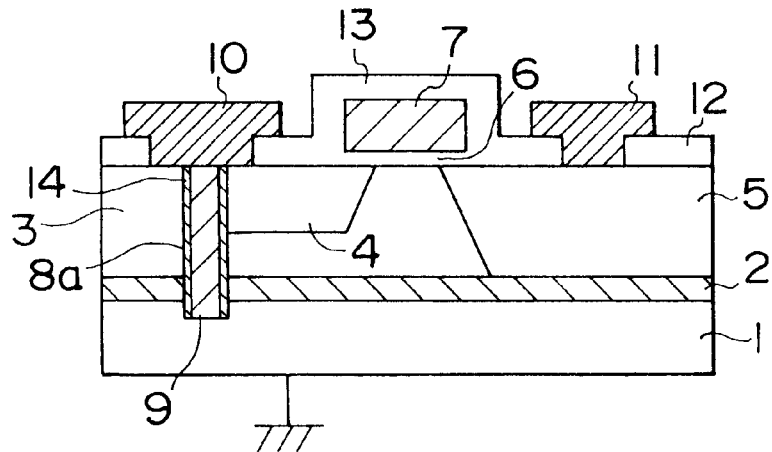
FIG. 3 is a sectional view of the second preferred embodiment of the MOS device according to the present invention.

The second preferred embodiment according to the present invention will be described with respect to FIG. 3. The difference of the second preferred embodiment from the first is that in the former a second conductive member 14 made of impurity-doped polycrystal silicon or metal silicide is formed on the inner wall of a trench 8a and the first conductive member 9 is embedded in the trench 8a. The combined resistivity of the first and second conductive members 9 and 14 is 100 $\mu\Omega$·cm or less. The total dimension of the first and second conductive members 9 and 14 is of 4 $\mu$m×100 $\mu$m in cross section with depth of 10 $\mu$m. Other configuration of the second preferred embodiment is the same as that of the first and hence its description is omitted here. In the second preferred embodiment, the first conductive member 9 is enclosed by the cylindrical second conductive member 14 in the trench 8a. This configuration prevents silicon atoms from diverging from the semiconductor layer 3 to restrict the existence of the resistance between the source and the ground. This is an advantage of the second preferred embodiment other than the advantage the same as that of the first preferred embodiment already described.

Figure 4:
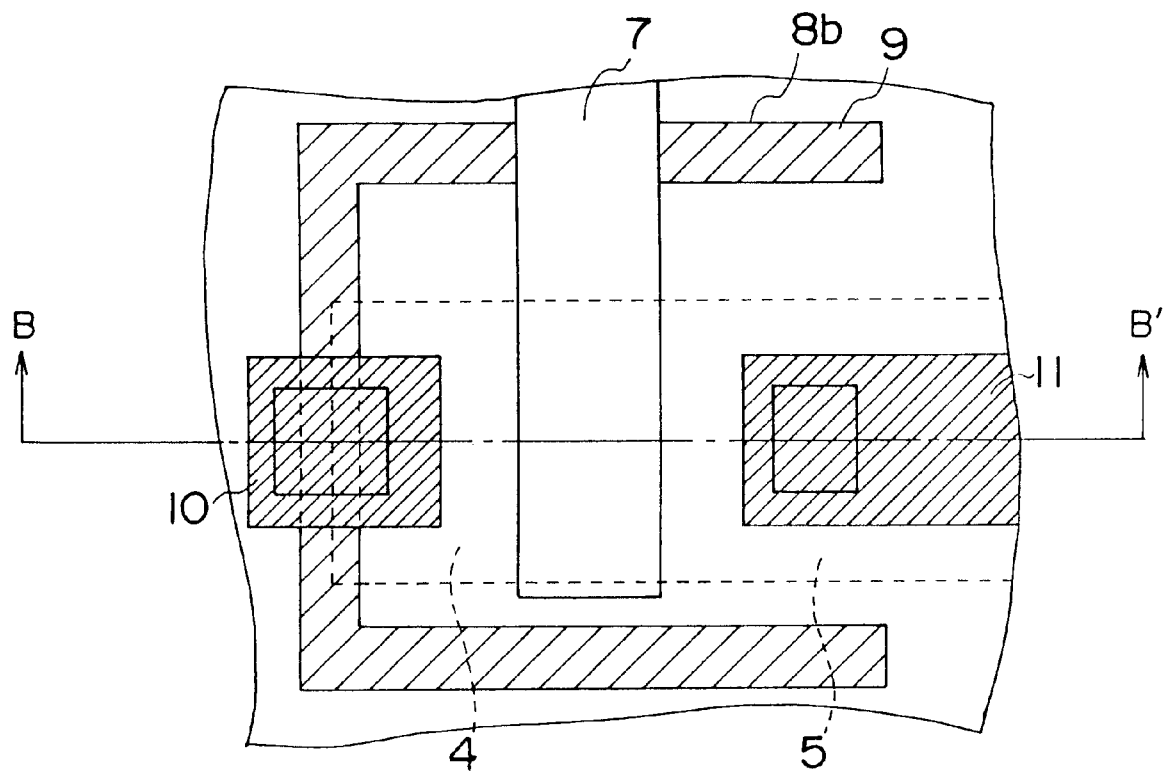
FIG. 4 is a top view of the third preferred embodiment of the MOS device according to the present invention.

The third preferred embodiment will be described with reference to FIG. 4. The semiconductor substrate 1 and the protective film 13 over the gate electrode 7 are omitted from the top view of FIG. 4. The source electrode 10 is located on a c-shaped trench 8b in the figure. The conductive member 9 embedded in the trench 8b is of 100 $\mu\Omega$·cm or less in resistivity. The dimension of the conductive member 9 is 4 $\mu$m×100 $\mu$m in cross section and 10 $\mu$m in depth. Other configuration of the second preferred embodiment is the same as that of the first and hence its description is omitted here. A cross-sectional view of FIG. 4 along the arrows B and B' is the same as that shown in FIG. 2B. In the third preferred embodiment, since the transverse cross sectional area of the trench 8b is larger than that of the trench 8 of the first preferred embodiment, the cross-sectional area of a current passage becomes large to significantly reduce common source resistance that causes delay of the device operation at high frequencies. This is an advantage of the third preferred embodiment other than the advantage the same as that of the first preferred embodiment already described.

Figure 5:
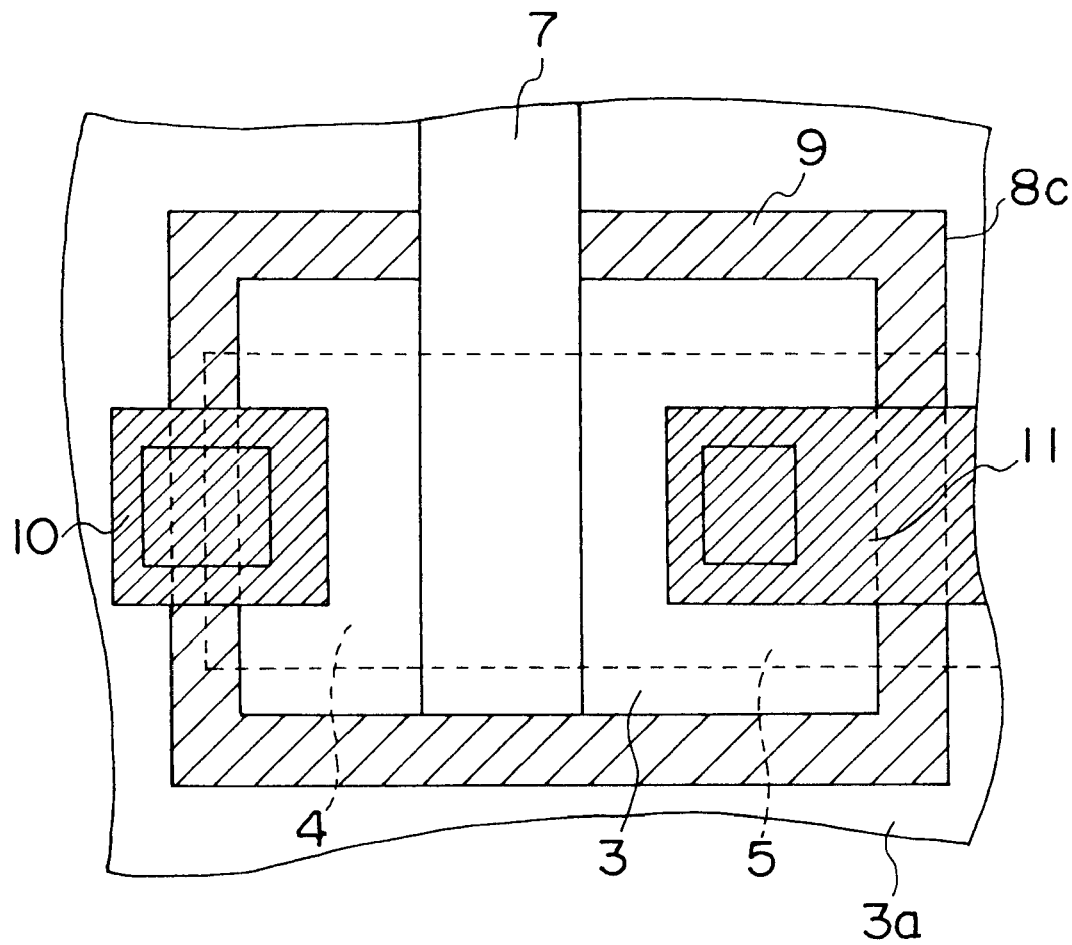
FIG. 5 is a top view of the fourth preferred embodiment of the MOS device according to the present invention.

The fourth preferred embodiment will be described with reference to FIG. 5. The semiconductor substrate 1 and the protective film 13 over the gate electrode 7 are omitted from the top view of FIG. 5. The source and drain electrodes 10 and 11 are located on a trench 8c that is formed so as to surround the electrodes 10 and 11 in the figure. The conductive member 9 embedded in the trench 8c is of 100 $\mu\Omega$·cm or less in resistivity. The dimension of the conductive member 9 is 4 $\mu$m×100 $\mu$m in cross section and 10 $\mu$m in depth. This configuration significantly reduces common source resistance compared to the third preferred embodiment. Further, in the fourth embodiment, since the semiconductor layer 3 and a semiconductor layer 3a are separated from each other by the trench 8c, any increase in potential of the semiconductor layer 3a does not lead increase in the potential of the semiconductor layer 3 due to the arrangement that the first conductive member 9 in the trench 8c is grounded. The fourth preferred embodiment is thus free from any external influence. These are advantages of the fourth preferred embodiment other than the advantage the same as that of the first preferred embodiment already described.

The third and fourth preferred embodiments may have another conductive member, like the second conductive member 14 of the second preferred embodiment, provided on the inner walls of the trenches 8b and 8c, respectively.

Further, the following configuration is available as the fifth preferred embodiment: a plurality of MOS-FETs are formed on a semiconductor substrate, trenches each surrounds one MOS-FET are formed in one member.

As described above, the present invention provides significantly small ground inductance and output capacity to obtain preferable high frequency characteristics.

What is claimed is:

1. A semiconductor device comprising:
    a semiconductor substrate of a specific conductive type;
    an insulation layer;
    a semiconductor layer of the conductive type stacked on the semiconductor substrate via the insulation; and
    a conductive member made of a metal material and embedded in a trench formed from a portion of the semiconductor layer to the semiconductor substrate via the insulation layer, the trench having a shape such that the conductive member embedded therein completely surrounds the semiconductor layer, said conductive member connecting said semiconductor layer to said semiconductor substrate.

2. A metal oxide semiconductor device comprising:
    a grounded semiconductor substrate of a first conductive type;
    an insulation layer formed on the semiconductor substrate;
    a semiconductor layer of the first conductive type formed on the insulation layer;
    a source region of a second conductive type formed in the semiconductor layer;
    a drain region of the second conductive type formed in the semiconductor layer, a portion of the drain region reaching the insulation layer;
    a gate insulation layer formed on the semiconductor layer and between the source and drain regions;
    a gate electrode formed on the gate insulation layer and between the source and drain regions;
    a first conductive member made of a metal material and embedded in a trench formed from a portion of the semiconductor layer to the semiconductor substrate via the insulation layer;
    a source electrode for connecting the conductive member to the source region; and
    a drain electrode connected to the drain region, wherein the source electrode is connected to the grounded semiconductor substrate by means of the first conductive member embedded in the trench, the trench having a shape such that the first conductive member embedded therein completely surrounds the source and drain regions of the semiconductor layer.

3. A device according to claim 2, further comprising a second conductive member formed between an inner wall of the trench and the first conductive member embedded therein, the second conductive member made of a different material from a material of the embedded first conductive member.

4. A device according to claim 3, wherein the embedded conductive member and the second conductive member are of 100 $\mu\Omega$'cm or less in combined resistivity.

5. A device according to claim 3, wherein the second conductive member is made of material selected from a group consisting of impurity-doped polycrystal silicon and metal silicide.

6. A device according to claim 2, wherein the first conductive member is of 4 $\mu$m×100 $\mu$m in cross section and 10 $\mu$m in depth in the trench.

7. A device according to claim 2, wherein the first conductive member is of 4 $\mu$m×100 $\mu$m in cross section and 10 $\mu$m in depth in the trench.

8. A device according to claim 2, wherein the first conductive member is of 4 $\mu$m×100 $\mu$m in cross section and 10 $\mu$m in depth in the trench.

9. A device according to claim 2, wherein the first conductive member is of 100 $\mu\Omega$'cm or less in resistivity.

10. A device according to claim 2, wherein the first conductive member is of 100 $\mu\Omega$'cm or less in resistivity.

11. A device according to claim 2, wherein the first conductive member is of 100 $\mu\Omega$'cm or less in resistivity.

12. A device according to claim 2, wherein the first conductive member is made of material selected from a group consisting of aluminum, aluminum silicide, tungsten silicide, molybdenum silicide, titanium silicide and impurity-doped polysilicon of $10^{19}$ cm$^{-3}$ or more.

13. A semiconductor device comprising:
    a semiconductor substrate of a specific conductive type;
    an insulation layer;
    a semiconductor layer of the conductive type stacked on the semiconductor substrate via the insulation; and
    a conductive member having a resistivity of 100 $\mu\Omega$·cm or less and embedded in a trench formed from a portion of the semiconductor layer to the semiconductor substrate via the insulation layer, the trench having a shape such that the conductive member embedded therein completely surrounds the semiconductor layer, said conductive member short-circuiting said semiconductor layer to said semiconductor substrate.

* * * * *